(12) United States Patent
Li

(10) Patent No.: US 11,588,007 B2
(45) Date of Patent: Feb. 21, 2023

(54) DISPLAY PANEL AND DISPLAY DEVICE

(71) Applicant: WuHan TianMa Micro-Electronics Co., Ltd., Wuhan (CN)

(72) Inventor: Xue Li, Wuhan (CN)

(73) Assignee: WuHan TianMa Micro-Electronics Co., Ltd., Wuhan (CN)

(*) Notice: Subject to any disclaimer, the term of this patent is extended or adjusted under 35 U.S.C. 154(b) by 0 days.

(21) Appl. No.: 17/474,323

(22) Filed: Sep. 14, 2021

(65) Prior Publication Data

US 2021/0408216 A1  Dec. 30, 2021

(30) Foreign Application Priority Data

Jun. 3, 2021 (CN) .......................... 202110619756.4

(51) Int. Cl.
| | |
|---|---|
| *G06F 3/041* | (2006.01) |
| *H01L 27/32* | (2006.01) |
| *H01L 51/52* | (2006.01) |
| *H01L 51/00* | (2006.01) |

(52) U.S. Cl.
CPC ........ *H01L 27/3276* (2013.01); *G06F 3/0412* (2013.01); *H01L 27/323* (2013.01); *H01L 51/0097* (2013.01); *H01L 51/5253* (2013.01); *G06F 2203/04102* (2013.01); *H01L 2251/5338* (2013.01)

(58) Field of Classification Search
CPC ..... G06F 3/041; G06F 3/0412; H01L 27/323; H01L 51/5253; H01L 51/0097
See application file for complete search history.

(56) References Cited

U.S. PATENT DOCUMENTS

| 9,766,737 | B2* | 9/2017 | Ahn | G09G 3/3208 |
| 10,181,576 | B2* | 1/2019 | Chung | H01L 51/5253 |
| 10,811,486 | B2* | 10/2020 | Li | H01L 27/3276 |
| 10,811,623 | B2* | 10/2020 | Park | H01L 51/0097 |
| 2017/0075464 | A1* | 3/2017 | Ahn | G06F 3/041 |
| 2018/0076415 | A1* | 3/2018 | Chung | H01L 27/3276 |
| 2019/0074328 | A1* | 3/2019 | Park | G06F 3/0445 |

(Continued)

FOREIGN PATENT DOCUMENTS

| CN | 106992263 A | 7/2017 |
| CN | 107068715 A | 8/2017 |

(Continued)

*Primary Examiner* — Olga V Merkoulova
(74) *Attorney, Agent, or Firm* — Kilpatrick Townsend & Stockton, LLP

(57) ABSTRACT

Provided are a display panel and a display device. The display panel includes a display area and a non-display area. The non-display area includes a bending area and a binding area. The bending area is located between the display area and the binding area in a first direction. The bending area is provided with a first signal trace. The display panel further includes a substrate and a protection structure. The protection structure includes a first protection structure. The first protection structure includes at least a first protection layer, a second protection layer, and a third protection layer arranged in stack in a second direction, the first protection layer is located on one side of the second protection layer farther from the substrate in the second direction, the third protection layer is located on one side of the second protection layer closer to the substrate.

19 Claims, 10 Drawing Sheets

(56) References Cited

U.S. PATENT DOCUMENTS

| | | | | |
|---|---|---|---|---|
| 2019/0207133 A1* | 7/2019 | Park | ................... | H01L 51/0097 |
| 2020/0110484 A1* | 4/2020 | Kim | ..................... | G06F 3/0446 |
| 2020/0235180 A1* | 7/2020 | Park | ................... | H01L 27/3276 |
| 2020/0303484 A1* | 9/2020 | Li | ....................... | H01L 27/3276 |
| 2020/0321292 A1* | 10/2020 | Park | ................... | H01L 27/3248 |

FOREIGN PATENT DOCUMENTS

| | | |
|---|---|---|
| CN | 208848933 U | 5/2019 |
| CN | 110993818 A | 4/2020 |
| CN | 112599576 A | 4/2021 |
| CN | 112652245 A | 4/2021 |

* cited by examiner

DISPLAY PANEL AND DISPLAY DEVICE

CROSS-REFERENCE TO RELATED APPLICATION(S)

This application claims priority to Chinese patent application No. 202110619756.4 filed Jun. 3, 2021, the disclosure of which is incorporated herein by reference in its entirety.

FIELD

The present disclosure relates to display techniques and, in particular, to a display panel and a display device.

BACKGROUND

In the existing active-matrix organic light-emitting diode (AMOLED) flexible display screen, water vapor easily invades the display panel and affects the normal display of the display panel. How to prevent the water vapor from intruding is an urgent problem to be solved.

SUMMARY

Embodiments of the present disclosure provide a display panel and a display device, so that the water vapor intrusion can be blocked and the corrosion risk can be reduced.

In one embodiment of the present disclosure provides a display panel. The display panel includes a display area and a non-display area, and the non-display area at least partially surrounds the display area.

The non-display area includes a bending area and a binding area. The bending area is located between the display area and the binding area in a first direction. The display panel further includes: a substrate. The bending area is provided with a first signal trace.

The display panel further includes a protection structure. The protection structure includes a first protection structure. The first protection structure includes at least a first protection layer, a second protection layer, and a third protection layer arranged in stack in a second direction, the first protection layer is located on one side of the second protection layer farther from the substrate in the second direction, the third protection layer is located on one side of the second protection layer closer to the substrate, the second direction is perpendicular to a plane where the substrate is located; the first protection layer includes an inorganic layer, the second protection layer includes a metal layer, and the third protection layer includes an inorganic layer; and the first signal trace is located on one side of the first protection layer closer to the substrate in the second direction.

In one embodiment of the present disclosure provides a display device including the display panel described in embodiments.

DETAILED DESCRIPTION

Figure 1:
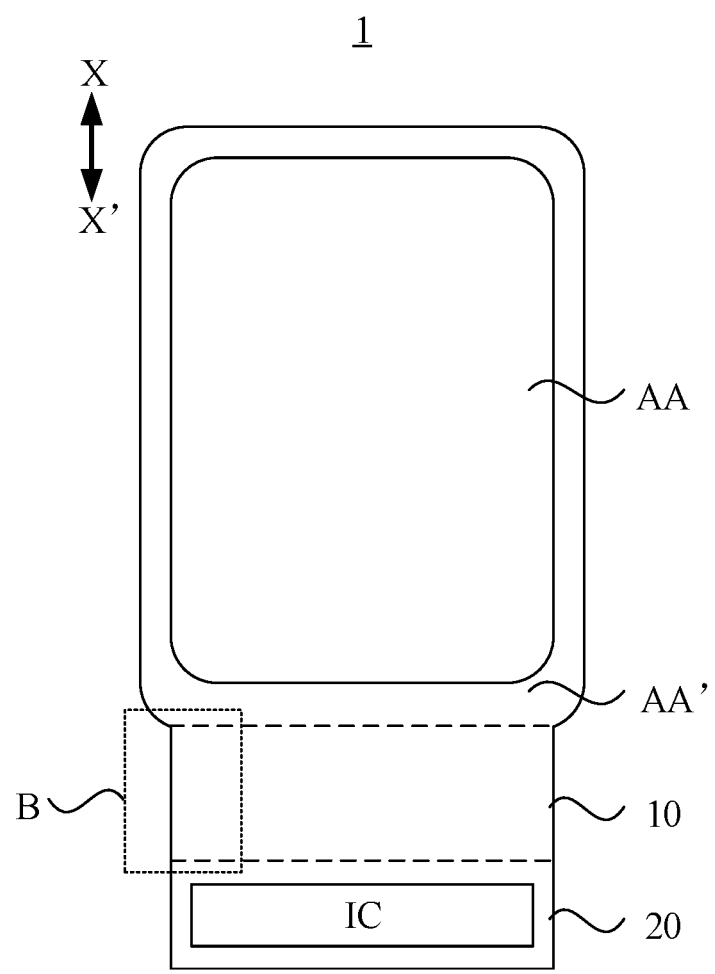
FIG. 1 is a structural diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

The existing AMOLED display panel generally uses a substrate bending process to bend a non-display area to a non-light-emitting side of a display panel to achieve a narrow bezel design. However, the inventors of the present application have found that in the non-display area bending process, the bending area between the display area and the non-display area is subjected to a large tensile stress, and a crack is easily generated at an edge of the bending area, and a position where the crack is generated becomes an invasion path of the water vapor, and the water vapor is easy to corrode signal traces provided in the non-display area. When the display panel starts to power on, an electric field is formed between different signal traces in the bending area, and an electrochemical corrosion reaction occurs between water molecules in the water vapor and the signal traces under the action of the electric field, and increasing the corrosion phenomenon.

In view of the above problems, according to the embodiment of the present disclosure, a protection structure is arranged in the display panel, the protection structure includes a first protection structure, the first protection structure includes a first protection layer, a second protection layer, and a third protection layer arranged in stack in a second direction perpendicular to a plane where the substrate is located, and a first signal trace is located on one side of the first protection layer closer to the substrate. Since the first protection layer includes an inorganic layer, the second protection layer includes a metal layer, and the third protection layer includes an inorganic layer, the first protection structure of an inorganic layer-metal layer-inorganic layer which are in contact with each other is formed in the second direction. Since the first protection structure of the inorganic layer-metal layer-inorganic layer has a strong water vapor blocking ability, the first protection structure can block the water vapor intrusion, avoid the water vapor from being transmitted to the first signal trace, reduce or eliminate the corrosion risk of the first signal trace, ensure the first signal trace to transmit the signal normally, and ensure the normal operation of the display panel.

The above embodiments of the present disclosure, and the embodiments of the present disclosure will be described clearly and completely in conjunction with the drawings in embodiments of the present disclosure.

Figure 2:
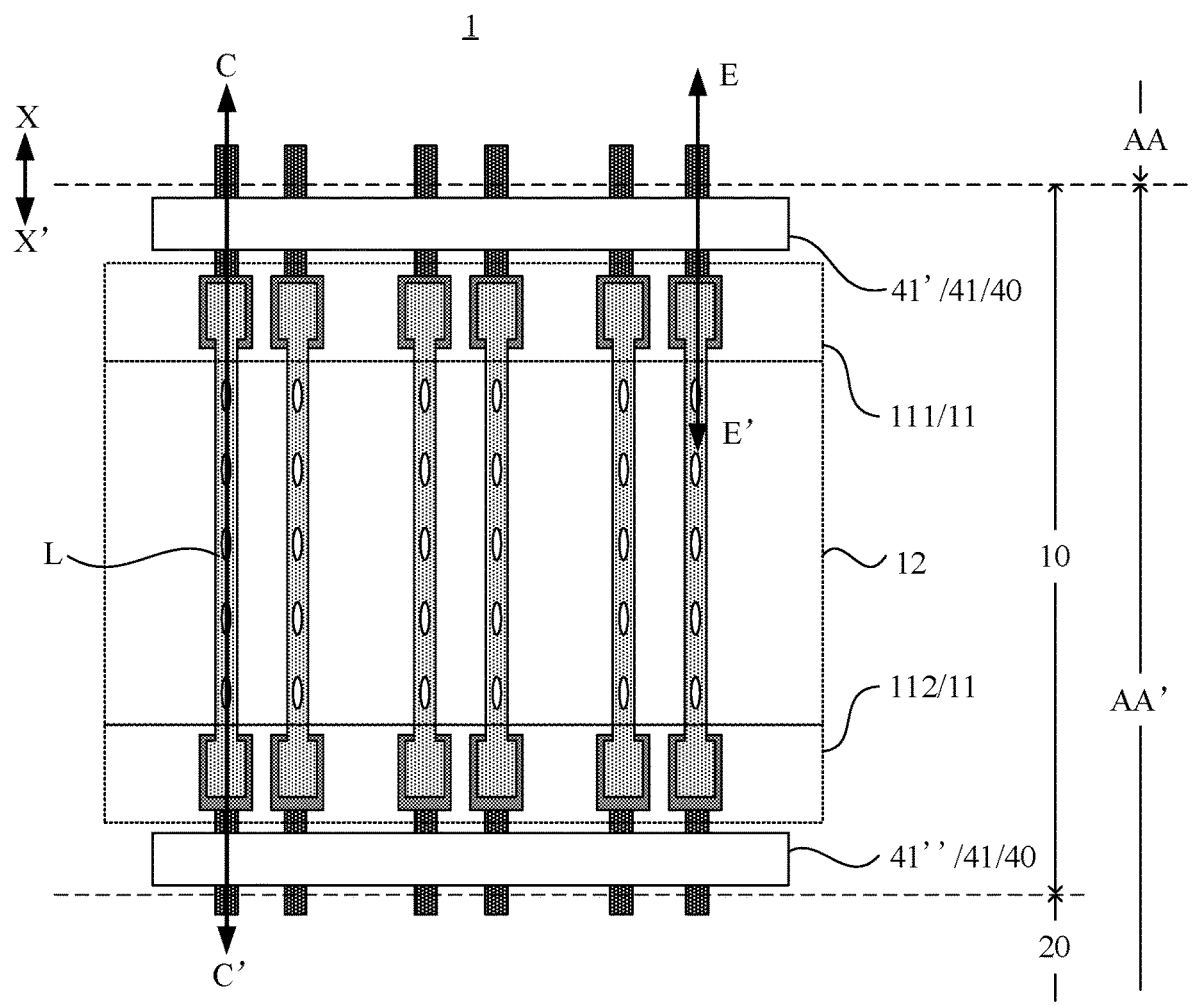
FIG. 2 is an enlarged view of an area B of FIG. 1.
Figure 3:
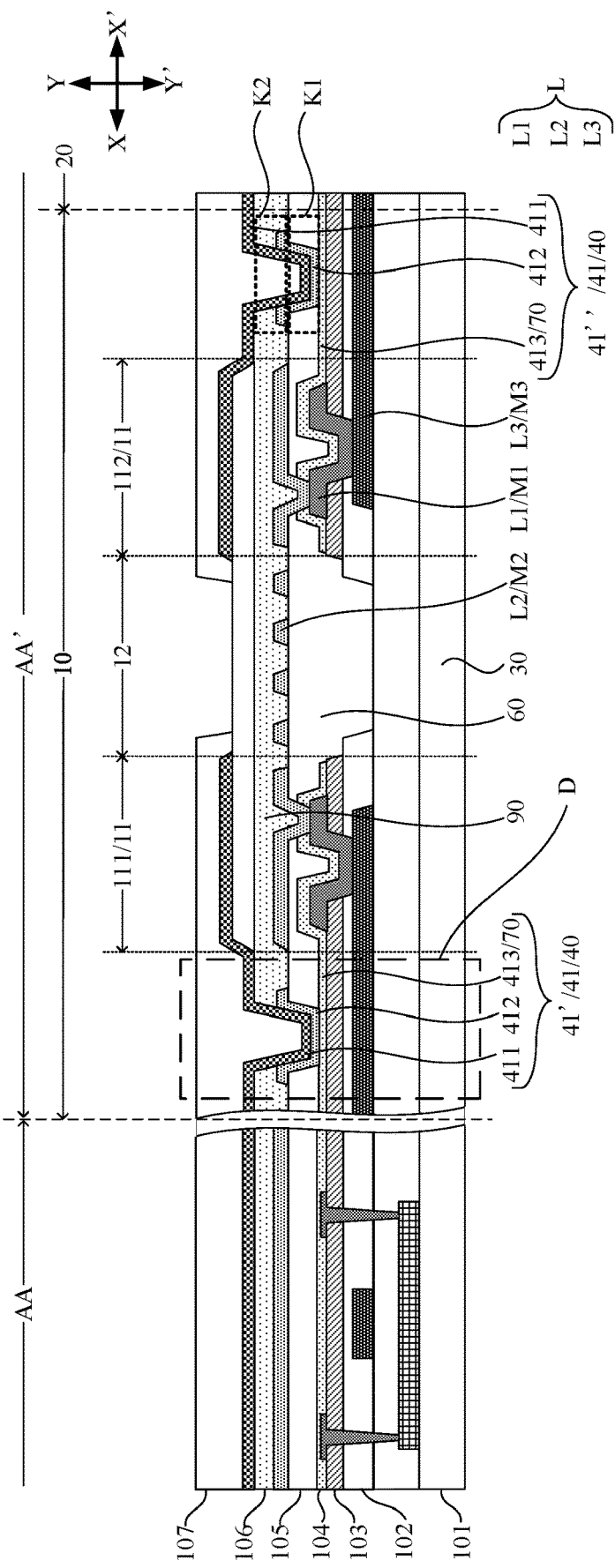
FIG. 3 is a sectional view taken along a line C-C' of FIG. 2.
Figure 4:
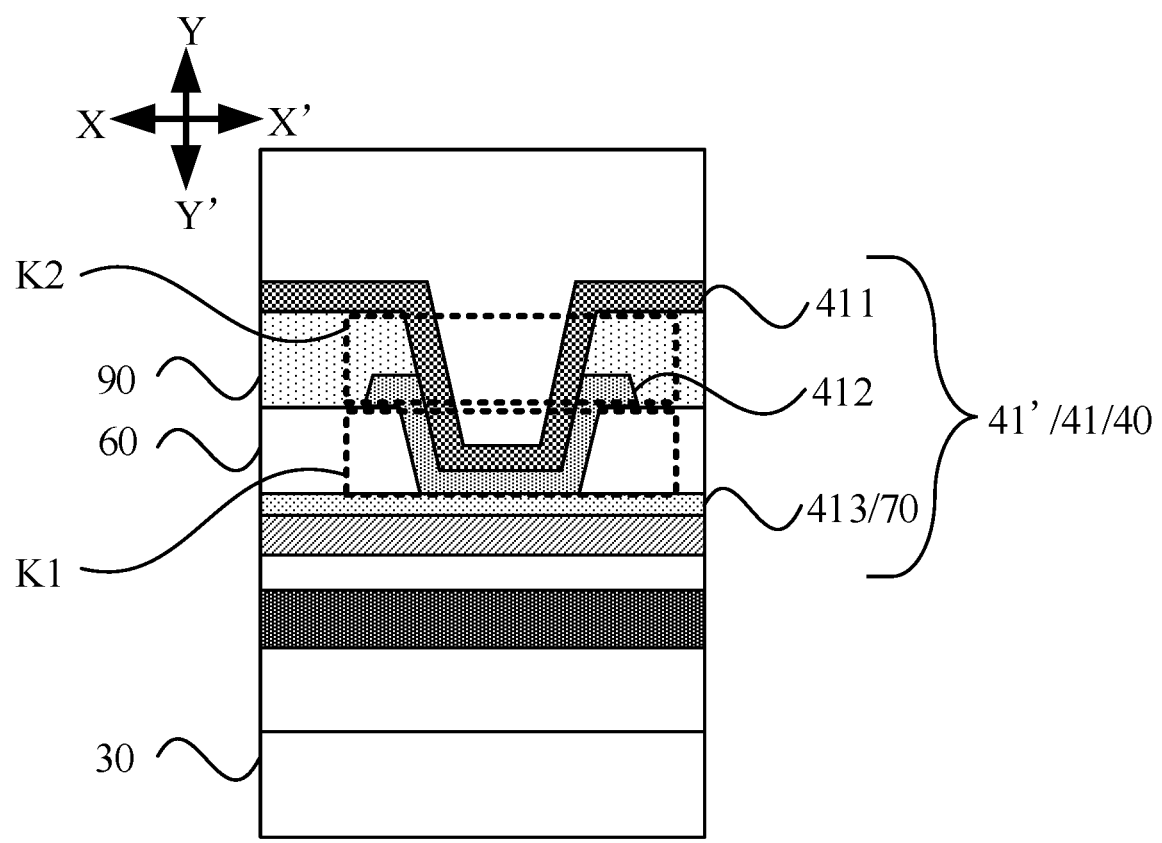
FIG. 4 is an enlarged view of a D area of FIG. 3.

FIG. 1 is a structural diagram of a display panel according to an embodiment of the present disclosure. FIG. 2 is an enlarged schematic view of an area B of FIG. 1. FIG. 3 is a sectional view taken along a line C-C' of FIG. 2. FIG. 4 is an enlarged schematic view of a D area of FIG. 3. Referring to FIGS. 1, 2, 3 and 4, the display panel 1 includes a display area AA and a non-display area AA'. The non-display area AA' at least partially surrounds the display area AA. The non-display area AA' includes a bending area 10 and a binding area 20. The bending area 10 is located between the display area AA and the binding area 20 in a first direction XX'. The display panel 1 further includes: a substrate 30, the bending area 10 is provided with a first signal trace L. The display panel 1 further includes a protection structure 40. The protection structure 40 includes a first protection structure 41. The first protection structure 41 includes at least a first protection layer 411, a second protection layer 412, and a third protection layer 413 arranged in stack in a second direction YY', in the second direction YY', the first protection layer 411 is located on one side of the second protection layer 412 farther from the substrate 30, the third protection layer 413 is located on one side of the second protection layer 412 closer to the substrate 30, the second direction YY' is perpendicular to a plane where the substrate 30 is located; the first protection layer 411 includes an inorganic layer, the second protection layer 412 includes a metal layer, and the third protection layer 413 includes an inorganic layer; and in the second direction YY', the first signal trace L is located on one side of the first protection layer 411 closer to the substrate 30.

It is to be noted that the first direction XX' refers to a direction from the display area AA to the bending area 10 before the display panel 1 shown in FIG. 1 is bent, and the second direction YY' refers to a direction perpendicular to a plane where the display panel 1 is located before the display panel 1 shown in FIG. 1 is bent.

In an embodiment, the non-display area AA' of the display panel 1 at least partially surrounds the display area AA. FIG. 1 illustrates an example where the non-display area AA' surrounds the display area AA. The non-display area AA' includes a bending area 10 and a binding area 20. The bending area 10 is a bendable area. For example, the non-display area AA' may be bent to a non-light-emitting side of the display panel in the bending area 10 to achieve the narrow bezel. The binding area 20 may bind a drive chip (IC) and a flexible circuit board (FPC), and the drive chip (IC) is merely illustrated in the figure exemplarily. The bending area 10 is provided with the first signal trace L. In order to improve the bending performance of the first signal trace L, generally holes may be made in the trace, such as the blank area circled by the solid coil on the first signal trace L shown in FIG. 2. One end of the first signal trace L may be electrically connected to a drive chip (IC), and the other end may be electrically connected, for example, to a pixel drive circuit (not shown in the figure) for providing a signal to the pixel drive circuit. If the water vapor enters an area where the first signal trace L is located, water molecules in the water vapor may cause corrosion to the first signal trace L. Furthermore, if multiple signals at different potentials are transmitted in the first signal trace L, there is a voltage difference between the signals at different potentials, and an electrochemical corrosion occurs to the first signal trace L under the action of the water molecules, which further aggravates the corrosion degree, and even causes an open circuit or a short circuit of the first signal trace L, affecting the normal signal transmission of the first signal trace L and the normal operation of the display panel 1.

To weaken or eliminate the corrosion phenomenon caused by the water vapor intrusion, the display panel 1 provided in the embodiment of the present disclosure is provided with a protection structure 40. The protection structure 40 includes a first protection structure 41 which may be located on one side of the bending area 10 closer to the display area AA and/or on one side of the bending area 10 closer to the binding area 20. FIGS. 2 and 3 exemplarily illustrate that the first protection structure 41 is provided on both sides of the bending area 10. The first protection structure 41 may block the invasion path of the water vapor, block the water vapor intrusion to a position of the first signal trace L, and avoid the first signal trace L from being corroded.

In an embodiment, the first protection structure 41 includes three protection layers arranged in stack in the second direction YY', i.e., the first protection layer 411 including the inorganic layer, the second protection layer 412 including the metal layer, and the third protection layer 413 including the inorganic layer. Compared with the organic layer, the inorganic layer has a better water-oxygen blocking ability. Furthermore, since the metal layer has a much larger elastic modulus than the inorganic layer, and has a better ductility, the metal layer is arranged between the inorganic layers, and a larger elastic enable may be stored under the action of a stress, so that the stress of an inorganic-metal interface is reduced, and slowing down the crack propagation. In addition, the inorganic layer can protect the metal layer, and the inorganic layers are arranged on both upper and lower film layers of the metal layer, and preventing other impurities from invading the metal layer from both sides. Therefore, the first protection structure 41 of the inorganic-metal-inorganic structure can block the extension of the crack and the water vapor, block the invasion path of the water vapor, protect the first signal trace L from the water vapor invasion, further protect the first signal trace L from the electrochemical corrosion, ensure the first signal trace L to transmit the signal normally, and ensure the display panel 1 to work normally.

It is to be noted that the drawings in the embodiment of the present disclosure are merely diagrams for facilitating the understanding of the solutions, the thickness of different film layers and the scale of different areas in the exemplary diagrams do not represent the actual situation.

In summary, according to the display panel provided in the embodiment of the present disclosure, the first protection structure is arranged in the display panel, and further includes the first protection layer, the second protection layer, and the third protection layer arranged in stack in the second direction perpendicular to the plane where the substrate is located, and the first signal trace is located on one side of the first protection layer closer to the substrate. Since the first protection layer includes the inorganic layer, the second protection layer includes the metal layer, and the third protection layer includes the inorganic layer, so that the first protection structure of the inorganic layer-metal layer-inorganic layer which are in contact with each other is formed in the second direction. Since the first protection structure of the inorganic layer-metal layer-inorganic layer has a strong water vapor blocking ability, the first protection structure can block the water vapor intrusion, avoid the water vapor from being transmitted to the first signal trace, reduce or eliminate the corrosion risk of the first signal trace, ensure the first signal trace to transmit the signal normally, and ensure the display panel to work normally.

In an embodiment, referring to FIGS. 2 and 3, the first protection structure 41 may include a first protection sub-structure 41' and/or a second protection sub-structure 41". Both FIGS. 2 and 3 illustrate by an example where the first protection sub-structure 41' and/or the second protection sub-structure 41". As shown in FIGS. 2 and 3, in the first direction XX', the first protection sub-structure 41' is located on one side of the bending area 10 closer to the display area AA, and the second protection sub-structure 41" is located on one side of the bending area 10 closer to the binding area 20.

In an embodiment, the first protection sub-structure 41' is arranged on one side of the bending area 10 closer to the display area AA, so that a crack generated at an edge position of the bending area 10 can be blocked from extending from one side of the bending area 10 closer to the display area AA to the bending area 10, and the bending area 10 is protected from being corroded by the water vapor from one side of the bending area 10 closer to the display area AA. The second protection sub-structure 41" is arranged on one side of the bending area 10 closer to the binding area 20, so that the crack generated at the edge position of the bending area 10 can be blocked from extending from one side of the bending area 10 closer to the binding area 20 to the bending area 10, and the bending area 10 is protected from being corroded by the water vapor from one side of the bending area 10 closer to the binding area. Furthermore, the first protection sub-structure 41' and the second protection sub-structure 41" are arranged on one side of the bending area 10 closer to the display area AA and one side of the bending area 10 closer to the binding area 20 respectively, so that the crack is blocked from extending from both sides of the bending area 10, thus the propagation path of the water vapor is blocked, and the bending area 10 is protected from being corroded in both directions.

In an embodiment, referring to FIGS. 2 and 3, the bending area 10 may include a wire changing area 11 and a first bending area 12. In the first direction XX', the wire changing area 11 is arranged on at least one side of the first bending area 12 in the first direction XX'. In the wire changing area 11, the first signal trace L includes a first trace section L1 and a second trace section L2. The first trace section L1 is located in a first metal layer M1, the second trace section L2 is located in a second metal layer M2, and the second trace section L2 is electrically connected to the first trace section L1. The second metal layer M2 is located on one side of the first metal layer M1 farther from the substrate 30. In the first direction XX', at least a part of the first protection structure 41 is located on one side of the wire changing area 11 farther from the first bending area 12; and the first protection layer 411 is located on one side of the second metal layer M2 farther from the substrate 30. It is to be noted that both FIGS. 2 and 3 exemplarily illustrate by an example where the wire changing areas 11 are arranged on both sides of the first bending area 12. Exemplarily, as shown in FIG. 3, the display panel 1 may include multiple film layers. A film layer 101 may be a substrate 101, a film layer 102 may be an inorganic insulating layer IMD, a film layer 103 may be an inorganic insulating layer ILD, the film layers 102 and 103 constitute a gate insulating layer, a film layer 104 may be an inorganic insulating layer PV, a film layer 105 may be an organic insulating layer BPL, the film layers 104 and 105 form a source/drain insulating layer, a film layer 106 may be a planarization PLN, and a film layer 107 may be an insulating layer OC. It is to be noted that in the embodiment of the present disclosure, the first metal layer M1 and the second metal layer M2 are merely a naming for ease of illustration, and do not represent the metal layer sequence in a direction from the substrate to the light-emitting layer in the actual display panel. The first signal trace L includes the first trace section L1 and the second trace section L2, the second trace section L2 is electrically connected to the first signal trace L located in the first bending area 12, and both the second trace section L2 and the first signal trace L are located in the second metal layer M2. The second metal layer M2 may be a Ti/Al/Ti structure, and the second metal layer M2 including the Ti/Al/Ti structure has a good ductility, which facilitates the bending of the bending area 10. Furthermore, since a resistance in the second metal layer M2 is small, the first signal trace L is arranged to include the first trace section L1 and the second trace section L2, ensuring the loss the first signal in the first signal trace L to be small during transmission. In an embodiment, the first trace section L1 and the second trace section L2 may be electrically connected in the wire changing area 11 by using wire changing holes. The first protection structure 41 is arranged on both sides of the wire changing area 11 farther from the first bending area 12, that is, the first protection substructure 41' is located on one side of the wire changing area 11 farther from the first bending area 12. The second protection substructure 41" is located on the other side of the wire changing area 11 farther from the first bending area 12, and the first protection layer 411 is located on one side of the second metal layer M2 farther from the substrate 30, so that the first protection structure 41 can prevent the crack at the edge position of the bending area 10 from extending continuously to the ware changing area 11, and playing a role of blocking the water vapor intrusion, protecting the first signal trace L from the water vapor invasion, protecting the first signal trace L from the electrochemical corrosion at the same time, ensuring the first signal trace L to transmit the signal normally, and ensuring the display panel 1 to work normally.

In an embodiment, referring to FIGS. 2 and 3, the wire changing area 111 may include a first wire changing area 111 and a second wire changing area 112. In the first direction XX', the first wire changing area 111 is located on one side of the first bending area 12 closer to the display area AA, and the second wire changing area 112 is located on one side of the first bending area 12 closer to the binding area 20. In the first direction XX', the first protection sub-structure 41' is located on one side of the first wire changing area 111 closer to the display area AA, and the second protection sub-structure 41" is located on one side of the second wire changing area 112 closer to the binding area 20.

In an embodiment, the first wire changing area 111 is arranged on one side of the first bending area 111 closer to the display area AA, and the first protection sub-structure 41' is provided on one side of the first wire changing area 111 closer to the display area AA. The first protection sub-structure 41' can block the crack generated at the edge position of the bending area 10 from extending from one side of the bending area 10 closer to the display area AA to the first wire changing area 111, avoid the water vapor from corroding the first signal trace L in the first wire changing area 111 from one side closer to the display area AA. The second wire changing area 112 is arranged on one side of the first bending area 12 closer to the binding area 20, and the second protection substructure 41" is arranged on one side of the second wire changing area 112 closer to the binding area 10, and the second protection substructure 41" can block the crack generated at the edge position of the bending area 10 from extending from one side of the bending area 10 closer to the binding area 10 to the second wire changing area 112, avoid the water vapor from corroding the first signal trace L in the second wire changing area 112 from one side closer to the binding area 10. That is, the crack generated at the edge position of the bending area 10 is blocked from extending from both sides of the wire changing area 11, thus the propagation path of water vapor is blocked, and the first signal trace L in the wire changing area 11 is protected from being corroded in both directions.

In an embodiment, referring to FIG. 3, the display panel 1 may further include a first organic insulating layer 60. The first organic insulating layer 60 is located between the first metal layer M1 and the second metal layer M2. A first opening K1 is arranged in the first organic insulating layer 60, in the first direction XX', the first opening K1 is located on one side of the bending area 10, in the second direction YY', the first opening K1 penetrates the first organic insulating layer 60, and at least a part of the first protection structure 41 is in direct contact with the first organic insulating layer 60 exposed from the first opening K1.

The first opening K1 is arranged in the first organic insulating layer 60. In the first direction XX', the first opening K1 is located on one side of the bending area 10. In an embodiment, the first opening K1 may be located on one side of the wire changing area 11 farther from the first bending area 12, that is, the first opening K1 may be located between the first wire changing area 111 and the display area AA, and between the second wire changing area 112 and the binding area 20.

In addition, at least a part of the first protection structure 41 is in direct contact with the first organic insulating layer 60 exposed from the first opening K1. In an embodiment, at least a part of a protection layer in the first protection structure 41 may be in direct contact with the first organic insulating layer 60, for example, all of a protection layer is in direct contact with the first organic insulating layer 60 exposed from the first opening K1, or a part of a protection layer is in direct contact with the first organic insulating layer exposed from the first opening K1, which will be described below in detail.

Exemplarily, the first organic insulating layer 60 is arranged between the first metal layer M1 and the second metal layer M2, and the first bending area 12 is filled with the first organic insulating layer 60, and ensuring the first bending area 12 to have both a good bending performance and a good supporting ability, and ensuring the stable structure of the display panel 1. Furthermore, given that the first organic insulating layer 60 has a relatively low water vapor blocking ability, in the embodiment of the present disclosure, the first organic insulating layer 60 located on both sides of the wire changing area 11 farther from the first bending area 12 in the first direction XX' is dug to arrange the first opening K1. The first opening K1 penetrates the first organic insulating layer 60, and the first protection structure 41 is arranged at the first opening K1, so that the first protection structure 41 is in direct contact with the first organic insulating layer 60. The first protection structure 41 blocks the possible water vapor transmission path in the first organic insulating layer 60, so that the intrusion path of the water vapor is further effectively blocked, and the first signal trace L in the wire changing area 11 is protected from being corroded.

On the basis of the above embodiment, the first protection structure 41 may include multiple different arrangement modes, and different arrangement modes will be described below at present.

Figure 5:
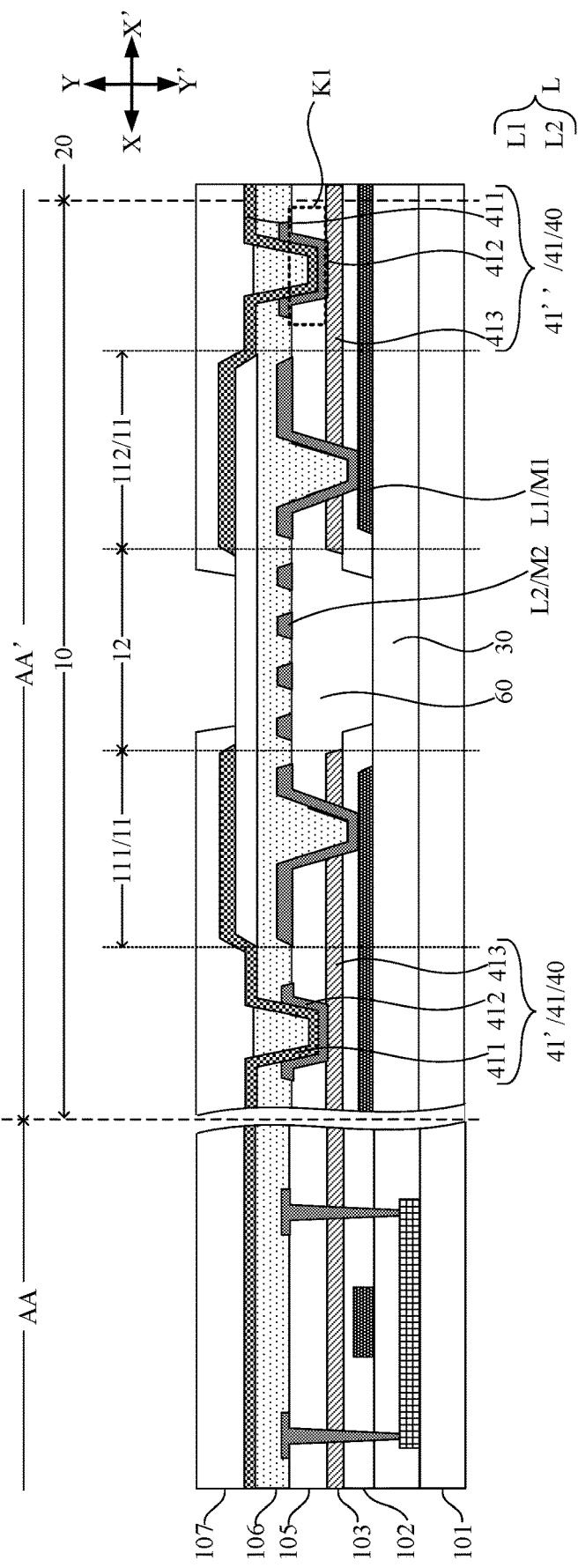
FIG. 5 is another sectional view taken along a line C-C' of FIG. 2.

In an embodiment, FIG. 5 is another sectional view taken along a line C-C' of FIG. 2. As shown in FIG. 5, a second metal layer M2 may include a second protection layer 412, and at least a part of the second protection layer 412 is in direct contact with a first organic insulating layer 60 exposed from a first opening K1.

In an embodiment, the second protection layer 412 may be arranged in the second metal layer M2, that is, the second protection layer 412 and a second trace section L2 may be arranged in the second metal layer M2 at the same time, and ensuring a simple arrangement process of the second protection layer 412 and a simple film layer structure of the display panel. It is to be noted that a first metal layer M1 and the second metal layer M2 in the embodiment of the present disclosure are merely a naming for ease of illustration, and do not represent the metal layers in the actual display panel. Exemplarily, in the embodiment, the first metal layer M1 may correspond to a film layer where a gate in a thin film transistor is located, the first metal layer M1 located in the display area may be used for transmitting a control signal or transmitting a scanning signal required in a display process, the second metal layer M2 may correspond to a film layer where a source and a drain in the thin film transistor are located, and the second metal layer M2 located in the display area may be used for transmitting a data signal or a first power voltage (PVDD) signal required in the display process. Since the first metal layer M1 corresponds to the film layer where the gate in the thin film transistor is located, and a material of the first metal layer M1 includes Mo. The second metal layer M2 may correspond to the film layer where the source and the drain in the thin film transistor are located, and a material of the second metal layer M2 may include Ti/Al/Ti. Since the Ti/Al/Ti structure has a small resistivity. A first signal trace L is arranged to include a first trace section L1 and a second trace section L2, and ensuring a loss of the first signal in the first signal trace L to be small during transmission. Furthermore, in a manufacturing process of the display panel 1, at the same time of digging holes on the first organic insulating layer 60 of a wire changing area 11, a hole-digging process of the first opening K1 is performed on the first organic insulating layer 60 at a position of a first protection structure 41, and then a same metal material is used for manufacturing the second trace section L2 and the second protection layer 412, so that the second protection layer 412 is in direct contact with the first organic insulating layer 60, and the second protection layer 412 is in direct contact with a below third protection layer 413, and the first protection layer 411 covers the second protection layer 412 at the first opening K1. In this way, the first protection structure 41 of the inorganic-metal-inorganic structure can block the intrusion path of the water vapor, protecting the first signal trace L in the wire changing area 11 from being corroded.

Furthermore, the first signal trace L located in a first bending area 12 and the second trace section L2 may both be located in the second metal layer M2, i.e., the film layer corresponding to a source and a drain in the thin film transistor. Since the second metal layer M2 includes the Ti/Al/Ti structure, the first signal trace L including the Ti/Al/Ti structure has a good ductility in the first bending area, which facilitates the bending of the first bending area 12.

At least a part of the second protection layer 412 is in direct contact with the first organic insulating layer 60 exposed from the first opening K1, which may be all of the second protection layer 412 being in direct contact with the first organic insulating layer 60 exposed from the first opening K1, that is, all second protection layer 412 is located within the first opening K1, or may be a part of the second protection layer 412 being in direct contact with the first organic insulating layer 60 exposed from the first opening K1, that is, a part of the second protection layer 412 is located within the first opening K1, and a part of the second protection layer 412 is located outside the first opening K1, for example, a part of the second protection layer 412 is further located on the first organic insulating layer 60 in the second direction YY' as shown in FIG. 5.

In an embodiment, referring to FIG. 3, the first signal trace L may further include a third trace section L3. The third trace section L3 is located in the third metal layer M3 and is electrically connected to the first trace section L1. The third metal layer M3 located on one side of the first metal layer M1 closer to the substrate 30. The second metal layer M2 may include the second protection layer 412, and at least part of the second protection layer 412 is in direct contact with the first organic insulating layer 60 exposed from the first opening K1.

In an embodiment, the first signal trace L may include the first trace section L1 located in the first metal layer M1, the second trace section L2 located in the second metal layer M2, and the third trace section L3 located in the third metal layer M3. The third metal layer M3 may correspond to the film layer where the gate in the thin film transistor is located, the first metal layer M1 located in the display area may be used for transmitting a control signal or transmitting a scanning signal required in a display process. The first metal layer M1 may correspond to a film layer where a source and a drain are located in the thin film transistor, the second metal layer M2 located in the display area may be used for transmitting a data signal or a first power voltage (PVDD) signal required in the display process. The second metal layer M2 may correspond to a metal layer where a fingerprint identification imaging aperture is located in the display panel, and fingerprint identification light required in a fingerprint identification phase may be transmitted through the second metal layer M2 located in the display area. The first metal layer M1 may include the Ti/Al/Ti structure, the second metal layer M2 may include the Ti/Al/Ti structure, and the third metal layer M3 may include Mo. The first metal layer M1 and the second metal layer M2 have a good ductility, which facilitates the bending of the bending area 10. Furthermore, since the third metal layer M3 has a large resistivity, the first signal trace L is arranged to include the first trace section L1, the second trace section L2, and the third trace section L3, ensuring a loss of the first signal to be small during transmission. Furthermore, since the first metal layer M1 where the first trace section L1 is located further needs to be provided with other traces, such as the first voltage signal trace PVDD and the second voltage signal trace PVEE. Therefore, to ensure that the traces in the first metal layer M1 can be provided normally, a signal transmitted in the first signal trace L can be changed from the first trace section L1 to the third trace section L3 by changing the traces, in this way, it can ensure that the traces in the first metal layer M1 can be arranged normally, the first signal trace L can be arranged normally, and the arrangement mode of the first signal trace L can be provided flexibly. The first trace section L1 is electrically connected to the second trace section L2 and the third trace section L3 separately to implement the signal transmission. In addition, the second protection layer 412 is arranged in the second metal layer M2 including the Ti/Al/Ti structure, that is, the second protection layer 412 and the second trace section L2 are arranged in the second metal layer M2 at the same time, and ensuring a simple arrangement process of the second protection layer 412 and a simple film layer structure of the display panel 1. Furthermore, in the manufacturing process of the display panel 1, at the same time of digging holes on the first organic insulating layer 60 of the wire changing area 11, a hole-digging process of the first opening K1 is performed on the first organic insulating layer 60 at the position of the first protection structure 41, and then a same metal material is used for manufacturing the second trace section L2 and the second protection layer 412, so that the second protection layer 412 is in direct contact with the first organic insulating layer 60, and the second protection layer 412 is in direct contact with the below third protection layer 413, and the first protection layer 411 covers the second protection layer 412 at the first opening K1. In this way, the first protection structure 41 of the inorganic-metal-inorganic structure can block the intrusion path of the water vapor, protecting the first signal trace L in the wire changing area 11 from being corroded.

Furthermore, the first signal trace L located in the first bending area 12 and the second trace section L2 may both be located in the second metal layer M2, i.e., corresponding to the metal layer where the fingerprint identification imaging aperture is located in the display panel. Since the second metal layer M2 includes the Ti/Al/Ti structure, the first signal trace L including the Ti/Al/Ti structure has the good ductility in the first bending area, facilitating the bending of the first bending area 12.

It is to be noted that the second metal layer M2 located in the display area may transmit other signals, such as a bridge metal layer between an anode (not shown) and the first metal layer M1 and is used for transmitting the data signal, the first power voltage (PVDD) signal or the like. The signal type transmitted in the second metal layer M2 located in the display area is not limited in the embodiment of the present disclosure.

At least a part of the second protection layer 412 is in direct contact with the first organic insulating layer 60 exposed from the first opening K1, which may be all of the second protection layer 412 being in direct contact with the first organic insulating layer 60 exposed from the first opening K1, that is, all second protection layer 412 is located within the first opening K1, or may be a part of the second protection layer 412 being in direct contact with the first organic insulating layer 60 exposed from the first opening K1, that is, a part of the second protection layer 412 is located within the first opening K1, and a part of the second protection layer 412 is located outside the first opening K1, for example, a part of the second protection layer 412 is further located on the first organic insulating layer 60 in the second direction YY' as shown in FIG. 3.

In an embodiment, referring to FIG. 3, the display panel 1 may further include a first inorganic insulating layer 70. The first inorganic insulating layer 70 is located between the first metal layer M1 and the second metal layer M2, and the first organic insulating layer 60 is located on one side of the first inorganic insulating layer 70 farther from the substrate 30. The first inorganic insulating layer 70 is further used as the third protection layer 413.

Exemplarily, the first organic insulating layer 60 and the first inorganic insulating layer 70 are arranged between the first metal layer M1 and the second metal layer M2, and the first bending area 12 is filled with the first organic insulating layer 60, and ensuring the first bending area 12 to have both a good bending performance and a good supporting ability, and ensuring the stable structure of the display panel 1. The first organic insulating layer 60 and the first inorganic insulating layer 70 may also serve to insulate the first metal layer M1 and the second metal layer M2. In addition, the first inorganic insulating layer 70 located on one side of the first organic insulating layer 60 closer to the substrate 30 is further used as the third protection layer 413, the first protection structure 41 of the inorganic-metal-inorganic structure is also formed, at the same time of effectively blocking the crack and the invasion path of the water vapor, and protecting the first signal trace L of the wire changing area 11 from being corroded, making the film layer of the display panel 1 be simple, realizing the thin and light setting of the display panel, and simplifying the manufacturing process of the display panel 1 and reducing the manufacturing cost.

Figure 6:
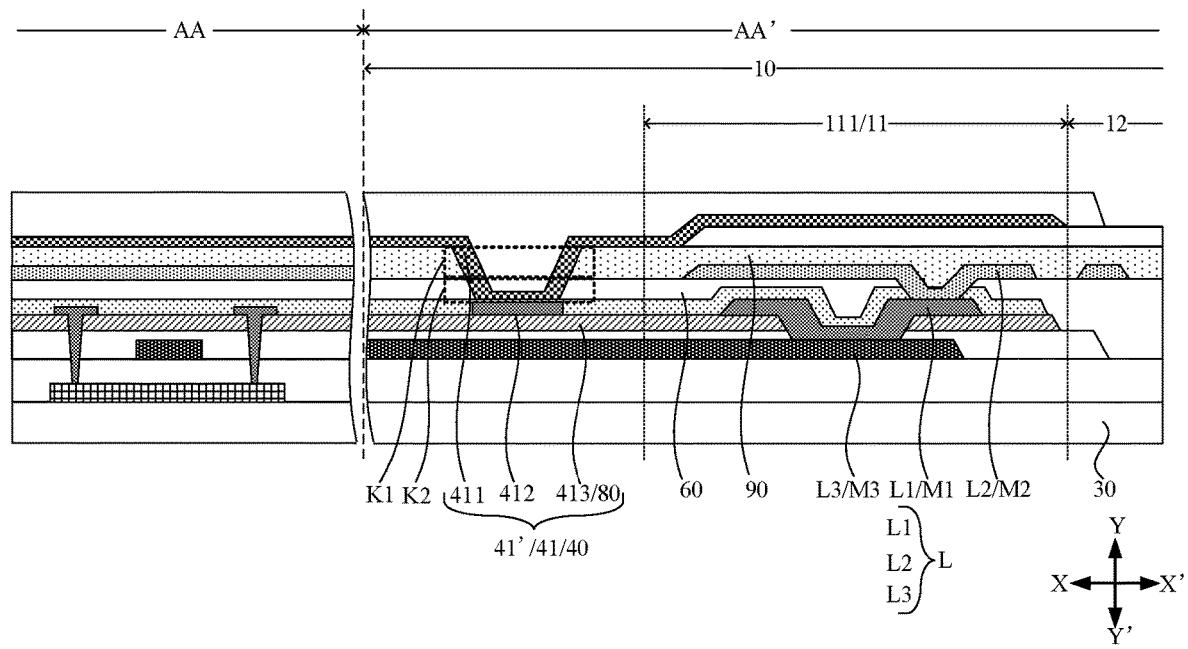
FIG. 6 is a sectional view taken along a line E-E' of FIG. 2.

In an embodiment, FIG. 6 is a sectional view taken along a line E-E' of FIG. 2. As shown in FIG. 6, a first signal trace L may further include a third trace section L3. The third trace section L3 is located in a third metal layer M3 and is electrically connected to a first trace section L1. The third metal layer M3 is located on one side of a first metal layer M1 closer to a substrate 30. The first metal layer M1 may include a second protection layer 412, at least a part of the first protection layer 411 is in direct contact with a first organic insulating layer 60 exposed from a first opening K1.

In an embodiment, in the wire changing area 11, the first signal trace L may include the first trace section L1 located in the first metal layer M1, a second trace section L2 located in the second metal layer M2, and a third trace section L3 located in the third metal layer M3. The first trace section L1 is electrically connected to the second trace section L2 and the third trace section L3 separately to implement the wire changing and the signal transmission. In addition, the second protection layer 412 is arranged in the first metal layer M1, that is, the second protection layer 412 and the first trace section L1 are arranged in the first metal layer M1 at the same time, and ensuring a simple arrangement process of the second protection layer 412 and a simple film layer structure of the display panel. Furthermore, in a manufacturing process of the display panel 1, at the same time of digging holes on the first organic insulating layer 60 of a wire changing area 11, a hole-digging process of the first opening K1 is performed on the first organic insulating layer 60 at a position of a first protection structure 41, and then the first protection layer 411 is manufactured, so that the first protection layer 411 is in direct contact with the first organic insulating layer 60, the first protection layer 411 is in direct contact with the below second protection layer 412, and the second protection layer 412 is in direct contact with the below third protection layer 413, in this way, the first protection structure 41 of the inorganic-metal-inorganic structure can block the intrusion path of the water vapor, protecting the first signal trace L in the wire changing area 11 from being corroded.

At least a part of the first protection layer 411 is in direct contact with the first organic insulating layer 60 exposed from the first opening K1, which may be all of the first protection layer 411 being in direct contact with the first organic insulating layer 60 exposed from the first opening K1, that is, the first protection layer 411 is located within the first opening K1, or may be a part of the first protection layer 411 being in direct contact with the first organic insulating layer 60 exposed from the first opening K1, that is, a part of the first protection layer 411 is located within the first opening K1, and a part of the first protection layer 411 is located outside the first opening K1, for example, a part of the first protection layer 411 is further located on the first organic insulating layer 60 in the second direction YY', as shown in FIG. 6.

In an embodiment, referring to FIG. 6, the display panel 1 may further include a second inorganic insulating layer 80. The second inorganic insulating layer 80 is located between the first metal layer M1 and the third metal layer M3. The second inorganic insulating layer 80 is further used as the third protection layer 413.

Exemplarily, the second inorganic insulating layer 80 is arranged between the first metal layer M1 and the third metal layer M3 to insulate the first metal layer M1 and the third metal layer M3. Meanwhile, the second inorganic insulating layer 80 is further used as the third protection layer 413, and the first protection structure 41 of the inorganic-metal-inorganic structure is also formed, which can not only protect the first trace section L1, the second trace section L2, and the third trace section L3 in the wire changing area 11 from being corroded by the water vapor, but also make the film layer of the display panel 1 be simple, realizing the thin and light setting of the display panel, and simplifying the manufacturing process of the display panel 1 and reducing the manufacturing cost.

In an embodiment, referring to FIGS. 3 and 6, the wire changing area 11 may further include a planarization layer 90. The planarization layer 90 is located on one side of the second metal layer M2 farther from the substrate 30. The planarization layer 90 is provided with a second opening K2. In a first direction XX', the second opening K2 is located on one side of the bending area 10. In a second direction YY', the second opening K2 penetrates the planarization layer 90 in the second direction. At least a part of the first protection layer 411 is in direct contact with the planarization layer 90 exposed from the second opening K2.

The planarization layer 90 is provided with the second opening K2. In the first direction XX', the second opening K2 is located on one side of the bending area 10. In an embodiment, the second opening K2 may be located on one side of the wire changing area 11 farther from the first bending area 12, that is, the second opening K2 may be located between a first wire changing area 111 and a display area AA, and between a second wire changing area 112 and a binding area 20.

At least a part of the first protection layer 411 is in direct contact with the planarization layer 90 exposed from the second opening K2, which may be all of the first protection layer 411 being in direct contact with the planarization layer 90 exposed from the second opening K2, that is, the first protection layer 411 is located within the second opening K2, or may be a part of the first protection layer 411 being in direct contact with the planarization layer 90 exposed from the second opening K2, that is, a part of the first protection layer 411 is located within the second opening K2, and a part of the first protection layer 411 is located outside the second opening K2, for example, a part of the first protection layer 411 is further located on the planarization layer 90 in the second direction YY', as shown in FIGS. 3 and 6.

Exemplarily, the planarization layer 90 is arranged on one side of the second metal layer M2 farther from the substrate 30, and the planarization layer 90 planarizes a film layer located below the planarization layer 90, and facilitating the manufacture of a film layer on the planarization layer 90, and the planarization layer 90 may also insulate the second metal layer M2 and a metal film layer on the second metal layer M2. The planarization layer 90 located on both sides of the wire changing area 11 farther from the first bending area 12 is dug in the first direction XX', the second opening K2 is arranged. The second opening K2 penetrates the planarization layer 90, and the first protection layer 411 is arranged at the second opening K2, so that the first protection layer 411 is in direct contact with the planarization layer 90. In this way, the first protection structure 41 of the inorganic-metal-inorganic structure can block the possible water vapor transmission path in the first organic insulating layer 60, and improving the protection ability, more effectively protecting the first signal trace L in the wire changing area 11 from being corroded by the water vapor, further protecting the first signal trace L from the electrochemical corrosion, ensuring the first signal trace L to transmit the signal normally, and ensuring the display panel 1 to work normally.

Figure 7:
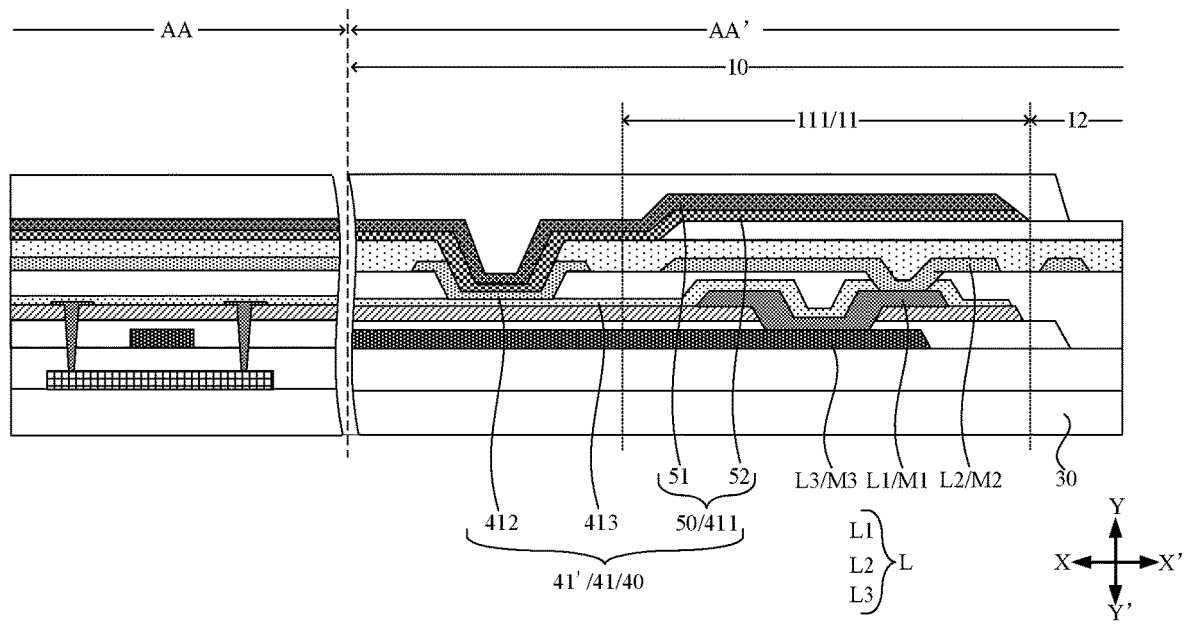
FIG. 7 is another sectional view taken along a line E-E' of FIG. 2.

In an embodiment, FIG. 7 is another sectional view taken along a line E-E' of FIG. 2. As shown in FIG. 7, the display panel 1 may further include a touch structure 50. The touch structure 50 is located on one side of the first signal trace L farther from the substrate 30 in the second direction YY'. The touch structure 50 includes a first touch insulating layer 51 and a second touch insulating layer 52; and the first touch insulating layer 51 and the second touch insulating layer 52 are further used as the first protection layer 411.

In an embodiment, the touch structure 50 of the display panel 1 is located on one side of the first signal trace L farther from the substrate 30 for implementing the touch function of the display panel. The touch structure 50 may include the first touch insulating layer 51 and the second touch insulating layer 52, and the first touch insulating layer 51 and the second touch insulating layer 52 are further used as the first protection layer 411, i.e., forming an inorganic-inorganic-metal-inorganic first protection structure 41 to further improve the effect of blocking the water vapor intrusion. As shown in FIGS. 3, 5, 6 and 7, at least part of the first protection structure 41 is located on one side of the wire changing area 11 farther from the first bending area 12, which may be at least one protection layer of the first protection structure 41 located on one side of the wire changing area 11 farther from the first bending area. FIGS. 3, 5, 6 and 7 illustrate by an example where the second protection layer 412 is located on one side of the wire changing area 11 farther from the first bending area 12. Furthermore, a part of the at least one protection layer of the first protection structure 41 may be further located in the wire changing area 11, and the first protection structure located in the wire changing area 11 is used for protecting the wire changing area 11, such as encapsulating the wire changing area 11 from one side of the wire changing area 11 farther from the substrate 30, as shown in FIGS. 3, 5, 6, and 7. FIGS. 3, 5, 6, and 7 illustrate by an example where the first protection layer 411 includes a part located in the wire changing area 11.

Figure 8:
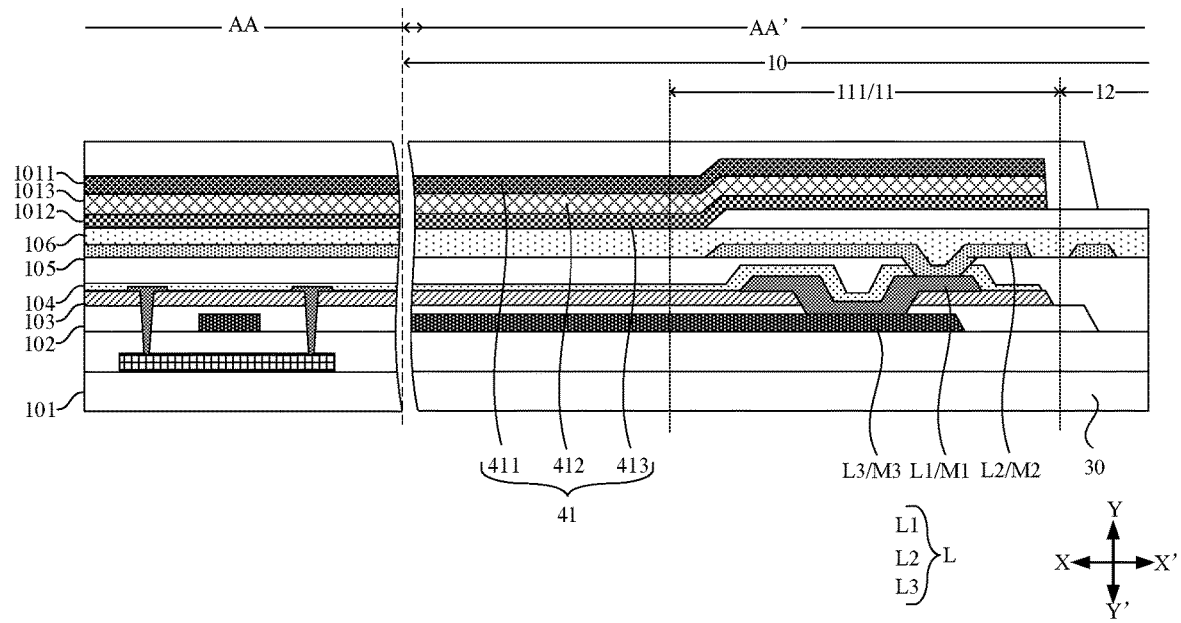
FIG. 8 is a sectional view of another display panel according to an embodiment of the present disclosure.

In an embodiment, FIG. 8 is a sectional view of another display panel according to an embodiment of the present disclosure. As shown in FIG. 8, a first protection layer 411, a second protection layer 412, and a third protection layer 413 may all be located on one side of a first signal trace L farther from a substrate 30.

In an embodiment, each protection layer of a first protection structure 41 of the inorganic-metal-inorganic structure is arranged on one side of the first signal trace L farther from the substrate 30, and a vertical projection of the first protection structure 41 on the substrate 30 and a vertical projection of the first signal trace L on the substrate 30 at least partially overlap with each other to achieve the effect of blocking the invasion path of the water vapor from above a bending area 10, protect a wire changing area 11 and a first bending area 12 from being corroded by the water vapor while reducing the occurrence probability of the electrochemical corrosion of the first signal trace in the bending area 10 with the water molecules under the action of the electric field, further protecting the bending area 10 and ensuring the display panel 1 to work normally.

Furthermore, the display panel 1 further includes a first touch insulating layer 1011, a second touch insulating layer 1012, and a touch metal layer 1013 on one side of the first signal trace L farther from the substrate 30. The first protection layer 411 and the first touch insulating layer 1011 may be arranged in the same layer, the second protection layer 412 and the touch metal layer 1013 may be arranged in the same layer, and the third protection layer 413 and the second touch insulating layer 1012 may be arranged in the same layer, to ensure the film layer of the display panel to be simple, realize the thin and light setting of the display panel, and simplify the manufacturing process and reduce the manufacturing cost.

It is to be noted that as shown in FIG. 8, a part of at least one protection layer in the first protection structure 41 may further be located in the wire changing area 11, and the first protection structure located in the wire changing area 11 is used for protecting the wire changing area 11, such as encapsulating the wire changing area 11 farther from the substrate 30. As shown in FIG. 8, FIG. 8 illustrates an example where a part of the first protection layer 411, a part of the second protection layer 412, and a part of the third protection layer 413 are all located in the wire changing area 11.

Figure 9:
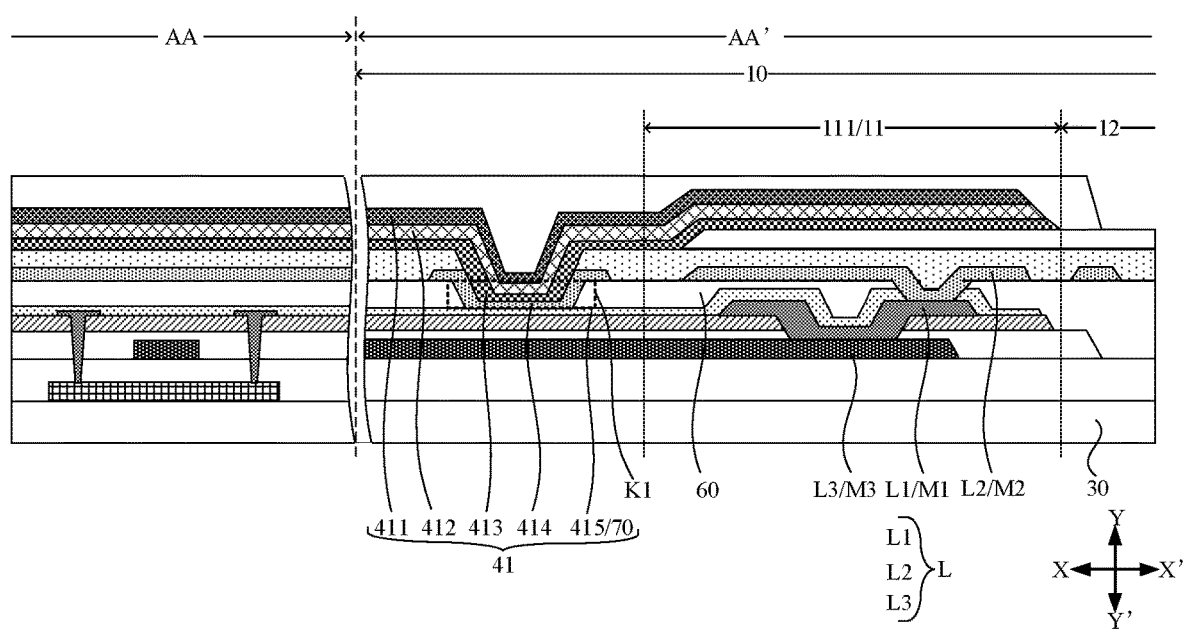
FIG. 9 is a sectional view of another display panel according to an embodiment of the present disclosure.

In an embodiment, FIG. 9 is a sectional view of another display panel according to an embodiment of the present disclosure. As shown in FIG. 9, a first protection structure 41 may further include a fourth protection layer 414 and a fifth protection layer 415. In a second direction YY', the third protection layer 413, the fourth protection layer 414 and the fifth protection layer 415 are arranged in stack. The fourth protection layer 414 is located on one side of the third protection layer 413 closer to a substrate 30, and the fifth protection layer 415 is located on one side of the fourth protection layer 414 closer to the substrate 30. The fourth protection layer 414 includes a metal layer, and the fifth protection layer 415 includes an inorganic layer.

In an embodiment, in the second direction YY', the first protection layer 411 including the inorganic layer, the second protection layer 412 including the metal layer, the third protection layer 413 including the inorganic layer, the fourth protection layer 414 including the metal layer, and the fifth protection layer 415 including the inorganic layer form an inorganic-metal-inorganic-metal-inorganic stacked first protection structure 41, further improving the protection ability, and more effectively blocking the extension of the crack and the propagation of the water vapor, further protecting the first signal trace L from the water vapor invasion, protecting the first signal trace L from the electrochemical corrosion, ensuring the first signal trace L to transmit the signal normally, and ensuring the display panel 1 to work normally.

In an embodiment, referring to FIG. 9, the bending area 10 may include a wire changing area 11 and a first bending area 12. In a first direction XX', the wire changing area 11 is arranged on at least one side of the first bending area 12. In the wire changing area 11, the first signal trace L includes at least a first trace section L1 and a second trace section L2, the first trace section L1 is located in the first metal layer M1, the second trace section L2 is located in the second metal layer M2, and the second trace section L2 is electrically connected to the first trace section L1. The second metal layer M2 is located on one side of the first metal layer M1 farther from the substrate 30. The display panel 1 may further include a first organic insulating layer 60 and a first inorganic insulating layer 70. The first organic insulating layer 60 and the first inorganic insulating layer 70 are located between the first metal layer M1 and the second metal layer M2, and the first organic insulating layer 60 is located on one side of the first inorganic insulating layer 70 farther from the substrate 30. A first opening K1 is arranged in the first organic insulating layer 60. In the first direction XX', the first opening K1 is located on one side of the bending area 10, and in a second direction YY', the first opening K1 penetrates the first organic insulating layer 60. The second metal layer M2 includes a fourth protection layer 414 in direct contact with at least a part of the first organic insulating layer 60 exposed from the first opening K1. The first inorganic insulating layer 70 is further used as the fifth protection layer 415.

The first opening K1 is arranged in the first organic insulating layer 60. In the first direction XX', the first opening K1 is located on one side of the bending area 10. In an embodiment, the first opening K1 may be located between the bending area 10 and the display area AA, and between the bending area 10 and the binding area 20.

In addition, at least a part of the fourth protection layer 414 is in direct contact with the first organic insulating layer 60 exposed from the first opening K1, which may be all of the fourth protection layer 414 being in direct contact with the first organic insulating layer 60 exposed from the first opening K1, that is, all fourth protection layer 414 is located within the first opening K1, or may be a part of the fourth protection layer 414 being in direct contact with the first organic insulating layer 60 exposed from the first opening K1, that is, a part of the fourth protection layer 414 is located within the first opening K1, and a part of the fourth protection layer 414 is located outside the first opening K1, for example, a part of the fourth protection layer 414 is further located on the first organic insulating layer 60 in the second direction YY' as shown in FIG. 9.

Exemplarily, the first organic insulating layer 60 and the first inorganic insulating layer 70 are arranged between the first metal layer M1 and the second metal layer M2, and the first bending area 12 is filled with the first organic insulating layer 60, and ensuring the first bending area 12 to have both a good bending performance and a good supporting ability, and ensuring the stable structure of the display panel 1. The first inorganic insulating layer 70 can play a role of further improving the insulating effect between the first metal layer M1 and the second metal layer M2. Furthermore, given that the first organic insulating layer 60 has a relatively low water vapor blocking ability, the first organic insulating layer 60 located on both sides of the wire changing area 11 farther from the first bending area 12 is dug in the first direction XX' to arrange the first opening K1 and penetrates the first organic insulating layer 60, and the fourth protection layer 414 is arranged at the first opening K1 so that the fourth protection layer 414 is in direct contact with the first organic insulating layer 60, and the fourth protection layer 414 is in direct contact with the below fifth protection layer 415, the third protection layer 413 covers the fourth protection layer 414 at the first opening K1, the third protection layer 413 is also in direct contact with the above second protection layer 412, and the second protection layer 412 is also in direct contact with the above first protection layer 411, so that the possible water vapor transmission path in the first organic insulating layer 60 can be blocked by the first protection structure 41 of the inorganic-metal-inorganic structure, further effectively blocking the intrusion path of the water vapor and protecting the first signal trace L in the wire changing area 11 from being corroded. In addition, the first inorganic insulating layer PV is further used as the fifth protection layer 415, at the same time of improving the protection ability, making the film layer of the display panel 1 be simple, realizing the thin and light setting of the display panel 1, and simplifying the manufacturing process of the display panel 1 and reducing the manufacturing cost.

It is to be noted that in the above embodiments, FIG. 9 merely illustrates an example where the fourth protection layer 414 and the second metal layer M2 are arranged in a same layer. but in embodiments of the present disclosure, the fourth protection layer 414 may further include multiple arrangement modes, or may be arranged in a same layer with other metal layers, for example, the fourth protection layer 414 may be arranged in a same layer with the first metal layer M1.

It is to be noted that as shown in FIG. 9, at least part of the first protection structure 41 is located on one side of the wire changing area 11 farther from the first bending area 12, and at least one protection layer of the first protection structure 41 may be located on one side of the wire changing area 11 farther from the first bending area 12. FIG. 9 illustrates that the fourth protection layer 414 is located on one side of the wire changing area 11 farther from the first bending area 12. Furthermore, a part of the at least one protection layer in the first protection structure 41 may be further located in the wire changing area 11, and the first protection structure located in the wire changing area 11 is used for protecting the wire changing area 11, such as encapsulating the wire changing area 11 from one side of the wire changing area 11 farther from the substrate 30, as shown in FIG. 9. FIG. 9 illustrates an example where a part of the first protection layer 411, a part of the second protection layer 412, and a part of the third protection layer 413 are all located in the wire changing area 11.

Figure 10:
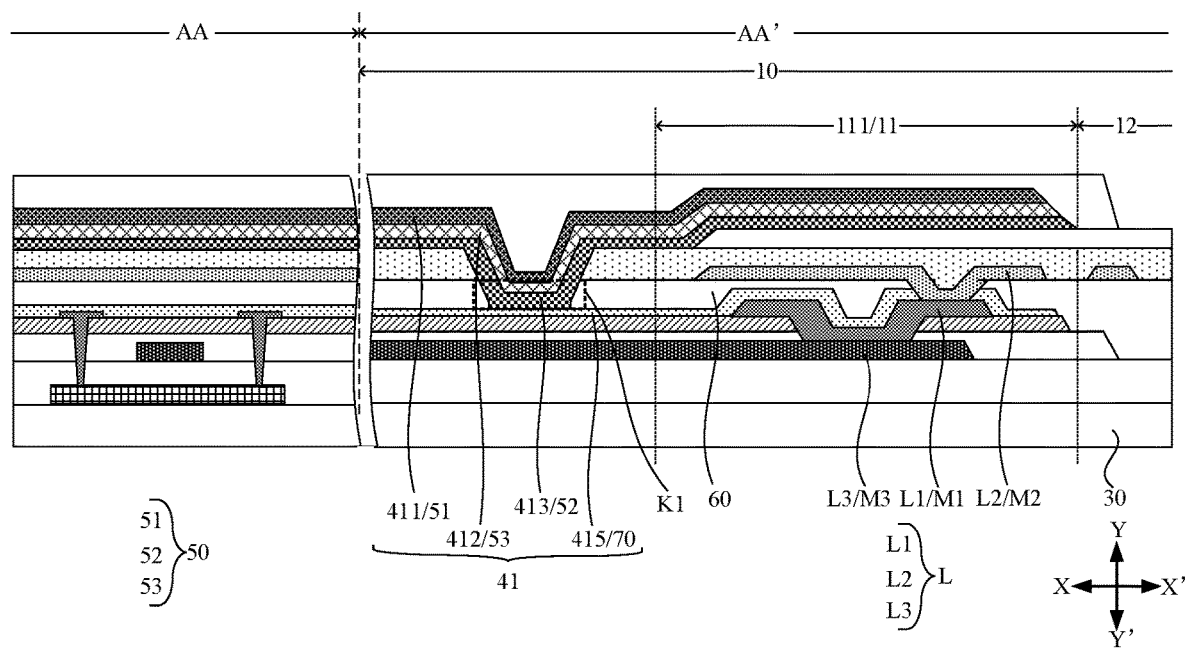
FIG. 10 is a sectional view of another display panel according to an embodiment of the present disclosure.

In an embodiment, FIG. 10 is a sectional view of another display panel according to an embodiment of the present disclosure. As shown in FIG. 10, a first protection structure 415 may further include a fifth protection layer 415. In a second direction YY', a third protection layer 413 and the fifth protection layer 415 may be arranged in stack. The fifth protection layer 415 includes an inorganic layer.

In an embodiment, in the second direction YY', a first protection layer 411 including the inorganic layer, a second protection layer 412 including the metal layer, the third protection layer 413 including the inorganic layer, and the fifth protection layer 415 including the inorganic layer form an inorganic-metal-inorganic-inorganic stacked first protection structure 41, further improving the protection ability, and more effectively blocking the extension of the crack and the propagation of the water vapor, further protecting the first signal trace L from the water vapor invasion, protecting the first signal trace L from the electrochemical corrosion, ensuring the first signal trace L to transmit the signal normally, and ensuring the display panel 1 to work normally.

It is to be noted that the fifth protection layer 415 described in this embodiment and the fifth protection layer 415 described in the above embodiment represent a same film layer in the actual structure of the display panel, thus the same description is adopted here as in the above embodiment.

In an embodiment, referring to FIG. 10, the bending area 10 may include a wire changing area 11 and a first bending area 12. In a first direction XX', the wire changing area 11 is arranged on at least one side of the first bending area 12. In the wire changing area 11, the first signal trace L includes at least a first trace section L1 and a second trace section L2, the first trace section L1 is located in a first metal layer M1, the second trace section L2 is located in a second metal layer M2, and the second trace section L2 is electrically connected to the first trace section L1. The second metal layer M2 is located on one side of the first metal layer M1 farther from the substrate 30. The display panel 1 may further include a first organic insulating layer 60 and a first inorganic insulating layer 70. The first organic insulating layer 60 and the first inorganic insulating layer 70 are located between the first metal layer M1 and the second metal layer M2, and the first organic insulating layer 60 is located on one side of the first inorganic insulating layer 70 farther from the substrate 30. A first opening K1 is arranged in the first organic insulating layer 60. In the first direction XX', the first opening K1 is located on one side of the bending area 10, and in a second direction YY', the first opening K1 penetrates the first organic insulating layer 60. At least a part of a third protection layer 413 is in direct contact with the first organic insulating layer 60 exposed from the first opening K1. The first inorganic insulating layer 70 is further used as the fifth protection layer 415.

In the first direction XX', the first opening K1 is located on one side of the bending area 10. In an embodiment, the first opening K1 may be located between the bending area 10 and the display area AA or between the bending area 10 and the binding area 20.

In addition, at least a part of the third protection layer 413 is in direct contact with the first organic insulating layer 60 exposed from the first opening K1, which may be all of the third protection layer 413 being in direct contact with the first organic insulating layer 60 exposed from the first opening K1, that is, all third protection layer 413 is located within the first opening K1, or may be a part of the third protection layer 413 being in direct contact with the first organic insulating layer 60 exposed from the first opening K1, that is, a part of the third protection layer 413 is located within the first opening K1, and a part of the third protection layer 413 is located outside the first opening K1, for example, a part of the third protection layer 413 is further located on the first organic insulating layer 60 in the second direction YY' as shown in FIG. 10.

Exemplarily, the first organic insulating layer 60 and the first inorganic insulating layer 70 are arranged between the first metal layer M1 and the second metal layer M2, and the first bending area 12 is filled with the first organic insulating layer 60, and ensuring the first bending area 12 to have both a good bending performance and a good supporting ability, and ensuring the stable structure of the display panel 1. The first inorganic insulating layer 70 can play a role of further improving the insulating effect between the first metal layer M1 and the second metal layer M2. Furthermore, given that the first organic insulating layer 60 has a relatively low water vapor blocking ability, the first organic insulating layer 60 located on both sides of the wire changing area 11 farther from the first bending area 12 is dug in the first direction XX' to arrange the first opening K1. The first opening K1 penetrates the first organic insulating layer 60, and the third protection layer 413 is arranged at the first opening K1, so that the third protection layer 413 is in direct contact with the first organic insulating layer 60 and the third protection layer 413 is in direct contact with a below fourth protection layer 414. A second protection layer 412 covers the third protection layer 413 at the first opening K1, meanwhile, the second protection layer 412 is in direct contact with the above first protection layer 411, so that the possible water vapor transmission path in the first organic insulating layer 60 can be blocked by the first protection structure 41 of the inorganic-metal-inorganic structure, further effectively blocking the intrusion path of the water vapor and protecting the first signal trace L in the wire changing area 11 from being corroded. In addition, the first inorganic insulating layer 70 is further used as the fifth protection layer 415, at the same time of improving the protection ability, making the film layer of the display panel 1 be simple, realizing the thin and light setting of the display panel 1, and simplifying the manufacturing process of the display panel 1 and reducing the manufacturing cost.

It is to be noted that as shown in FIG. 10, at least one protection layer in the first protection structure may further include a part located in the wire changing area 11, and the first protection structure located in the wire changing area 11 may be used for protecting the wire changing area 11, such as encapsulating the wire changing area 11 from one side of the wire changing area 11 farther from the substrate 30. As shown in FIG. 10, FIG. 10 illustrates an example where a part of the first protection layer 411, a part of the second protection layer 412, and a part of the third protection layer 413 are all located in the wire changing area 11.

In an embodiment, referring to FIG. 10, the display panel 1 may further include a touch structure 50. The touch structure 50 is located on one side of the first signal trace L farther from the substrate 30. In the second direction YY'. The touch structure 50 may include a first touch insulating layer 51, a touch electrode layer 53, and a second touch insulating layer 52 arranged in stack. The touch electrode layer 53 is located between the first touch insulating layer 51 and the second touch insulating layer 52. The first touch insulating layer 51 is located on one side of the touch electrode layer 53 farther from the substrate 30. The first touch insulating layer 51 is further used as the first protection layer 411. The touch electrode layer 53 includes the second protection layer 412. The second touch insulating layer 52 is further used as the third protection layer 413.

In an embodiment, the touch structure of the display panel 1 is located on one side of the first signal trace L farther from the substrate 30 for implementing the touch function of the display panel. The touch structure 50 may include the first touch insulating layer 51, the touch electrode layer 53, and the second touch insulating layer 52, and the first touch insulating layer 51 may be further used as the first protection layer 411, the touch electrode layer 53 and the second protection layer 412 are arranged in a same layer and in a same material, and the second touch insulating layer 52 is further used as the third protection layer 413, at the same time of blocking the invasion path of the water vapor, making the film layer of the display panel 1 be simple, realizing the thin and light setting of the display panel, and simplifying the manufacturing process of the display panel 1 and reducing the manufacturing cost.

Figure 11:
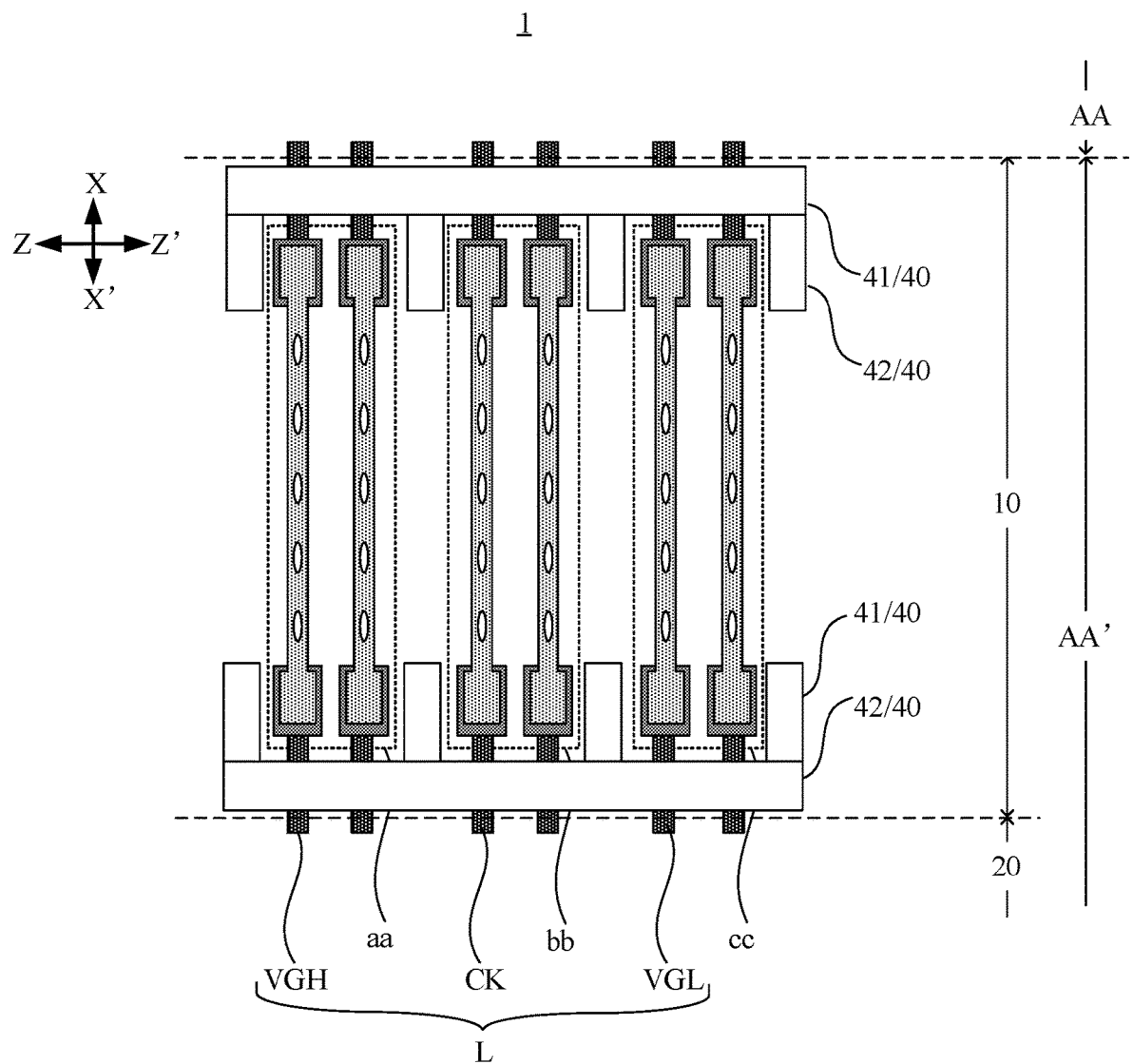
FIG. 11 is another enlarged view of an area B of FIG. 1.

In an embodiment, FIG. 11 is another enlarged view of an area B of FIG. 1. As shown in FIG. 11, the display panel 1 may include a first area aa, a second area bb, and a third area cc arranged in a third direction ZZ'. Multiple first signal traces L may include a first voltage signal trace VGH, a second voltage signal trace VGL, and a clock signal trace CK. A voltage on the first voltage signal trace VGH is greater than a voltage on the second voltage signal trace VGL. The first voltage signal trace VGH is located in the first area aa, the clock signal trace CK is located in the second area bb, and the second voltage signal trace VGL is located in the third area cc; and the third direction ZZ' intersects the first direction XX'. The protection structure 40 further includes a second protection structure 42, the second protection structure 42 is included between the first voltage signal trace VGH and the clock signal trace CK, and/or the second protection structure 42 is included between the second voltage signal trace VGL and the clock signal trace CK; and the second protection structure 42 includes at least the first protection layer, the second protection layer, and the third protection layer arranged in stack in the second direction YY'.

In an embodiment, the protection structure 40 may include the first protection structure 41 and the second protection structure 42. In the first direction XX', the first protection structure 41 is located on one side of the bending area 10 closer to the display area AA, or on one side of the bending area 10 closer to the binding area 20, or on one side of the bending area 10 closer to the display area AA and on one side of the bending area 10 closer to the binding area 20, so that the crack at an edge of the bending area 10 can be effectively protected from extending to the bending area 10, the propagation path of the water vapor can be disconnected and the corrosion risk can be reduced. In the third direction ZZ', the second protection structure 42 is located between the first voltage signal trace VGH and the clock signal trace CK, or between the second voltage signal trace VGL and the clock signal trace CK, or the second protection structure 42 is arranged between the first voltage signal trace VGH and the clock signal trace CK, and between the second voltage signal trace VGL and the clock signal trace CK, so that an electric field formed between the first voltage signal trace VGH and the clock signal trace CK can be effectively shielded, and an electric field formed between the second voltage signal trace VGL and the clock signal trace CK can be effectively shielded, and further reducing the probability of electrochemical corrosion reaction and further weakening the corrosion phenomenon. It is to be noted that the arrangement and beneficial effects of the protection layer of the second protection structure 42 are similar to those of the first protection structure 41. Reference can be made to the above description and illustration of the first protection structure 41, which is not repeated herein.

The display panel provided in the embodiments of the present disclosure binds the non-display area to the non-light-emitting side by bending the substrate, and the binding area of the non-display area of the display area is electrically connected by the bending area of the non-display area, and realizing the narrow bezel. The protection structure is arranged in the display panel, the protection structure includes the first protection structure and the second protection structure, the first protection structure includes the first protection layer, the second protection layer and the third protection layer arranged in stack in the second direction perpendicular to the plane where the substrate is located, and the first signal trace are is located on one side of the first protection layer closer to the substrate, since the first protection layer includes the inorganic layer, the second protection layer includes the metal layer, and the third protection layer includes the inorganic layer, the first protection structure of the inorganic layer-metal layer-inorganic layer which are in contact with each other is formed in the second direction. Since the first protection structure of the inorganic layer-metal layer-inorganic layer has a strong water vapor blocking ability, the first protection structure can block the water vapor intrusion, avoid the water vapor from being transmitted to the first signal trace, weaken or eliminate the corrosion risk of the first signal trace, ensure the first signal trace to transmit the signal normally, and ensure the normal operation of the display panel. The second protection structure is arranged between the first signal traces with different voltages, so that the electric field formed by the voltage difference can be shielded, the probability of electrochemical corrosion and the corrosion risk in the bending area can be further reduced. In addition, multiple protection layers are arranged on the protection structure, so that the protection ability can be further improved and the effect of protecting the bending area from being corroded can be improved. Each film layer is reasonably further used as the protection layer to make the film layer of the display panel 1 be simple, realize the thin and light setting of the display panel, and simplify the manufacturing process of the display panel 1 and reduce the manufacturing cost.

Figure 12:
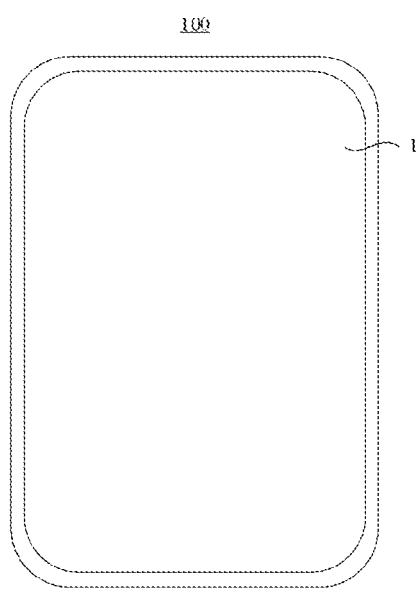
FIG. 12 is a structural diagram of a display device according to an embodiment of the present disclosure.

Based on the above embodiment, the embodiment of the present disclosure further provides a display device. FIG. 12 is a structural diagram of a display device according to an embodiment of the present disclosure. As shown in FIG. 12, the display device 100 includes the display panel 1 described in any one of the above embodiments. Therefore, the display device 100 also has the beneficial effects of the display panel 1 described in the preceding embodiments, and for the same details, reference may be made to the description of the preceding display panel 1, and repetition will not made herein.

The display device 100 provided in embodiments of the present disclosure may be the phone shown in FIG. 12, or may be any electronic product with a display function, including and not limited to: televisions, laptops, desktop displays, tablet computers, digital cameras, smart bracelets, smart glasses, in-vehicle displays, industry-controlling equipment, medical displays, touch interactive terminals, etc., which will not be specifically limited in embodiments of the present disclosure.

What is claimed is:
1. A display panel, comprising
a display area and a non-display area, wherein
the non-display area at least partially surrounds the display area,
the non-display area comprises a bending area and a binding area, and the bending area is located between the display area and the binding area in a first direction; the display panel further comprises a substrate, and the bending area is provided with a first signal trace; and
the display panel further comprises a protection structure, wherein the protection structure comprises a first protection structure, wherein the first protection structure comprises at least a first protection layer, a second protection layer, and a third protection layer arranged in stack in a second direction, in the second direction, the first protection layer is located on one side of the second protection layer farther from the substrate, the third protection layer is located on one side of the second protection layer closer to the substrate, the second direction is perpendicular to a plane where the substrate is located;
the first protection layer comprises an inorganic layer, the second protection layer comprises a metal layer, and the third protection layer comprises an inorganic layer; and
the first signal trace is located on one side of the first protection layer closer to the substrate in the second direction,
wherein the first protection structure comprises at least one of a first protection sub-structure or a second protection sub-structure; and
in the first direction, the first protection sub-structure is located on one side of the bending area closer to the display area in the first direction, and the second protection sub-structure is located on one side of the bending area closer to the binding area.

2. The display panel of claim 1, wherein
the bending area comprises a wire changing area and a first bending area, and at least one side of the first bending area is provided with the wire changing area in the first direction;
in the wire changing area, the first signal trace comprises a first trace section and a second trace section, the first trace section is located in a first metal layer, the second trace section is located in a second metal layer, and the second trace section is electrically connected to the first trace section; and the second metal layer is located on one side of the first metal layer farther from the substrate; and
in the first direction, at least a part of the first protection structure is located on one side of the wire changing area farther from the first bending area; and the first protection layer is located on one side of the second metal layer farther from the substrate.

3. The display panel of claim 2, wherein
the wire changing area comprises a first wire changing area and a second wire changing area, in the first direction, the first wire changing area is located on one side of the first bending area closer to the display area, and the second wire changing area is located on one side of the first bending area closer to the binding area; and
in the first direction, the first protection sub-structure is located on one side of the first wire changing area closer to the display area, and the second protection sub-structure is located on one side of the second wire changing area closer to the binding area.

4. The display panel of claim 2, further comprising:
a first organic insulating layer, wherein the first organic insulating layer is located between the first metal layer and the second metal layer; and
wherein the first organic insulating layer is provided with a first opening, in the second direction, the first opening penetrates the first organic insulating layer, and at least a part of the first protection structure is in direct contact with the first organic insulating layer exposed from the first opening.

5. The display panel of claim 4, wherein
the second metal layer comprises the second protection layer; and
at least a part of the second protection layer is in direct contact with the first organic insulating layer exposed from the first opening.

6. The display panel of claim 4, wherein
the first signal trace further comprises a third trace section, the third trace section is located on a third metal layer and is electrically connected to the first trace section, and the third metal layer is located on one side of the first metal layer closer to the substrate; and
the second metal layer comprises the second protection layer, and at least a part of the second protection layer is in direct contact with the first organic insulating layer exposed from the first opening.

7. The display panel of claim 4, further comprising:
a first inorganic insulating layer, wherein the first inorganic insulating layer is located between the first metal layer and the second metal layer, and the first organic insulating layer is located on one side of the first inorganic insulating layer farther from the substrate; and
wherein the first inorganic insulating layer is further used as the third protection layer.

8. The display panel of claim 4, wherein
the first signal trace further comprises a third trace section, the third trace section is located on a third metal layer and is electrically connected to the first trace section, and the third metal layer is located on one side of the first metal layer closer to the substrate; and
the first metal layer comprises the second protection layer, and at least a part of the first protection layer is in direct contact with the first organic insulating layer exposed from the first opening.

9. The display panel of claim 8, further comprising a second inorganic insulating layer,
wherein the second inorganic insulating layer is located between the first metal layer and the third metal layer; and
wherein the second inorganic insulating layer is further used as the third protection layer.

10. The display panel of claim 4, wherein
the wire changing area further comprises a planarization layer, the planarization layer is located on one side of the second metal layer farther from the substrate; the planarization layer is provided with a second opening, and the second opening penetrates the planarization layer in the second direction; and
at least a part of the first protection layer is in direct contact with the planarization layer exposed from the second opening.

11. The display panel of claim 1, further comprising: a touch structure, wherein the touch structure is located on one side of the first signal trace farther from the substrate in the second direction;
wherein the touch structure comprises a first touch insulating layer and a second touch insulating layer; and
wherein the first touch insulating layer and the second touch insulating layer are further used as the first protection layer.

12. The display panel of claim 1, wherein the first protection layer, the second protection layer, and the third protection layer are all located on one side of the first signal trace farther from the substrate.

13. The display panel of claim 1, wherein
the first protection structure further comprises a fourth protection layer and a fifth protection layer, in the second direction, the third protection layer, the fourth protection layer and the fifth protection layer are arranged in stack, the fourth protection layer is located on one side of the third protection layer closer to the substrate, and the fifth protection layer is located on one side of the fourth protection layer closer to the substrate; and
the fourth protection layer comprises a metal layer, and the fifth protection layer comprises an inorganic layer.

14. The display panel of claim 13, wherein
the bending area comprises a wire changing area and a first bending area, and in the first direction, the wire changing area is arranged on at least one side of the first bending area;
in the wire changing area, the first signal trace comprises at least a first trace section and a second trace section, the first trace section is located in a first metal layer, the second trace section is located in a second metal layer, the second trace section is electrically connected to the first trace section, and the second metal layer is located on one side of the first metal layer farther from the substrate;
the display panel further comprises: a first organic insulating layer and a first inorganic insulating layer, wherein the first organic insulating layer and the first inorganic insulating layer are located between the first metal layer and the second metal layer, the first organic insulating layer is located on one side of the first inorganic insulating layer farther from the substrate, the first organic insulating layer is provided with a first opening, and in the second direction, the first opening penetrates the first organic insulating layer; and the second metal layer comprises the fourth protection layer, and at least part of the fourth protection layer in direct contact with the first organic insulating layer exposed from the first opening; and the first inorganic insulating layer is further used as the fifth protection layer.

15. The display panel of claim 1, wherein
the first protection structure further comprises a fifth protection layer, in the second direction, the third protection layer and the fifth protection layer are arranged in stack, and the fifth protection layer is located on one side of the third protection layer closer to the substrate; and the fifth protection layer comprises an inorganic layer.

16. The display panel of claim 15, wherein
the bending area comprises a wire changing area and a first bending area, and in the first direction, at least one side of the first bending area is provided with the wire changing area;

in the wire changing area, the first signal trace comprises at least a first trace section and a second trace section, the first trace section is located in a first metal layer, the second trace section is located in a second metal layer, and the second trace section is electrically connected to the first trace section; the second metal layer is located on one side of the first metal layer farther from the substrate;

the display panel further comprises a first organic insulating layer and a first inorganic insulating layer, wherein the first organic insulating layer and the first inorganic insulating layer are located between the first metal layer and the second metal layer, and the first organic insulating layer is located on one side of the first inorganic insulating layer farther from the substrate; the first organic insulating layer is provided with a first opening, and in the second direction, the first opening penetrates the first organic insulating layer;

at least a part of the third protection layer is in direct contact with the first organic insulating layer exposed from the first opening; and the first inorganic insulating layer is further used as the fifth protection layer.

17. The display panel of claim 1, further comprising:
a touch structure, wherein the touch structure is located on one side of the first signal trace farther from the substrate;

in the second direction, the touch structure comprises a first touch insulating layer, a touch electrode layer, and a second touch insulating layer arranged in stack, the touch electrode layer is located between the first touch insulating layer and the second touch insulating layer; the first touch insulating layer is located on one side of the touch electrode layer farther from the substrate;

the first touch insulating layer is further used as the first protection layer;

the touch electrode layer comprises the second protection layer; and the second touch insulating layer is further used as the third protection layer.

18. The display panel of claim 1, comprising:
a first area, a second area, and a third area arranged in a third direction; wherein a plurality of first signal traces comprise a first voltage signal trace, a second voltage signal trace, and a clock signal trace, and wherein a voltage on the first voltage signal trace is greater than a voltage on the second voltage signal trace;

wherein the first voltage signal trace is located in the first area, the clock signal trace is located in the second area, and the second voltage signal trace is located in the third area; and the third direction intersects the first direction;

wherein the protection structure further comprises a second protection structure, and the second protection structure is located at least one of: a location between the first voltage signal trace and the clock signal trace, or a location between the second voltage signal trace and the clock signal trace; and wherein the second protection structure comprises at least the first protection layer, the second protection layer, and the third protection layer arranged in stack in the second direction.

19. A display device, comprising:
a display panel,
wherein the display panel comprises a display area and a non-display area, wherein
the non-display area at least partially surrounds the display area, the non-display area comprises a bending area and a binding area, and the bending area is located between the display area and the binding area in a first direction; the display panel further comprises a substrate, and the bending area is provided with a first signal trace; and the display panel further comprises a protection structure, wherein the protection structure comprises a first protection structure, wherein the first protection structure comprises at least a first protection layer, a second protection layer, and a third protection layer arranged in stack in a second direction, in the second direction, the first protection layer is located on one side of the second protection layer farther from the substrate, the third protection layer is located on one side of the second protection layer closer to the substrate, the second direction is perpendicular to a plane where the substrate is located; the first protection layer comprises an inorganic layer, the second protection layer comprises a metal layer, and the third protection layer comprises an inorganic layer; and the first signal trace is located on one side of the first protection layer closer to the substrate in the second direction, wherein the first protection structure comprises at least one of a first protection sub-structure or a second protection sub-structure; and in the first direction, the first protection sub-structure is located on one side of the bending area closer to the display area in the first direction, and the second protection sub-structure is located on one side of the bending area closer to the binding area.

* * * * *